US010411386B2

(12) United States Patent
Kazama et al.

(10) Patent No.: US 10,411,386 B2
(45) Date of Patent: Sep. 10, 2019

(54) CONNECTION TERMINAL

(71) Applicant: NHK Spring Co., Ltd., Yokohama-shi (JP)

(72) Inventors: Toshio Kazama, Kanagawa (JP); Kazuya Souma, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 15/501,592

(22) PCT Filed: Aug. 7, 2015

(86) PCT No.: PCT/JP2015/072555
§ 371 (c)(1),
(2) Date: Feb. 3, 2017

(87) PCT Pub. No.: WO2016/021723
PCT Pub. Date: Feb. 11, 2016

(65) Prior Publication Data
US 2017/0229802 A1    Aug. 10, 2017

(30) Foreign Application Priority Data
Aug. 8, 2014 (JP) ................. 2014-162372

(51) Int. Cl.
H01R 13/24 (2006.01)
G01R 1/067 (2006.01)
G01R 1/04 (2006.01)

(52) U.S. Cl.
CPC ..... *H01R 13/2421* (2013.01); *G01R 1/06722* (2013.01); *H01R 13/24* (2013.01); *H01R 13/2471* (2013.01); *G01R 1/0416* (2013.01)

(58) Field of Classification Search
CPC ........................... H01R 11/18; H01R 13/2421
(Continued)

(56) References Cited

U.S. PATENT DOCUMENTS 4,838,801 A * 6/1989 Bertoglio ............ H01R 13/2471
439/482
4,904,213 A * 2/1990 Hock ..................... G01R 1/067
439/482
(Continued)

FOREIGN PATENT DOCUMENTS

CN   201029131 Y   2/2008
CN   101501509 A   8/2009
(Continued)

OTHER PUBLICATIONS

Office Action dated Mar. 8, 2017, issued for the Taiwanese patent application No. 104125773.
(Continued)

*Primary Examiner* — Tulsidas C Patel
*Assistant Examiner* — Marcus E Harcum
(74) *Attorney, Agent, or Firm* — Locke Lord LLP

(57) ABSTRACT

A conductive connection terminal is extensible and compressible in a longitudinal direction, and includes: a first contact member including a first tip portion configured to contact with one electrode of a contact target, and a first base end portion; a second contact member including a second tip portion configured to contact with another electrode of the contact target, and a plurality of tongue parts configured to contact with the first base end portion; an elastic member configured to extend and compress the first contact member and the second contact member in the longitudinal direction; and a load applying unit configured to apply a load to the tongue parts in a direction bringing the tongue parts into contact with an outer circumference of the first base end portion.

12 Claims, 17 Drawing Sheets

(58) Field of Classification Search
USPC .......................................................... 439/700
See application file for complete search history.

(56) References Cited

U.S. PATENT DOCUMENTS

| | | | | |
|---|---|---|---|---|
| 5,174,763 A * | 12/1992 | Wilson | ............... | G01R 1/07328 439/245 |
| 5,990,697 A * | 11/1999 | Kazama | ................. | G01R 1/067 324/72.5 |
| 6,396,293 B1 | 5/2002 | Vinther et al. | | |
| 6,462,567 B1 * | 10/2002 | Vinther | .............. | G01R 1/06722 324/754.14 |
| 6,655,983 B1 * | 12/2003 | Ishikawa | ............ | G01R 1/07314 324/755.01 |
| 7,256,593 B2 | 8/2007 | Treibergs | | |
| 7,559,769 B2 * | 7/2009 | Hsiao | .................... | H01R 12/52 439/66 |
| 7,598,757 B2 | 10/2009 | Nakamura | | |
| 7,677,901 B1 * | 3/2010 | Suzuki | ................. | G01R 1/0466 439/66 |
| 8,157,601 B2 * | 4/2012 | Lin | .................... | H01R 13/2421 439/700 |
| 8,373,430 B1 | 2/2013 | Sochor | | |
| 8,408,946 B1 * | 4/2013 | Sochor | ................ | H01R 4/4863 324/755.01 |
| 8,808,037 B2 | 8/2014 | Park | | |
| 2006/0279301 A1 * | 12/2006 | Treibergs | ............. | G01R 1/0466 324/754.05 |
| 2008/0214063 A1 | 9/2008 | Hsiao et al. | | |
| 2009/0075529 A1 | 3/2009 | Johnston et al. | | |
| 2009/0146672 A1 | 6/2009 | Nakamura | | |
| 2009/0253313 A1 | 10/2009 | Hsiao et al. | | |
| 2009/0311886 A1 | 12/2009 | Hsieh et al. | | |
| 2010/0041251 A1 * | 2/2010 | Nakayama | ............. | G01R 1/045 439/65 |
| 2011/0128025 A1 * | 6/2011 | Kazama | ............. | G01R 1/06722 324/754.03 |
| 2012/0129408 A1 | 5/2012 | Kimura et al. | | |
| 2012/0202390 A1 | 8/2012 | Park | | |
| 2013/0012076 A1 | 1/2013 | Hwang | | |
| 2014/0162503 A1 * | 6/2014 | Yamada | ............... | H01R 4/4863 439/786 |

FOREIGN PATENT DOCUMENTS

| | | |
|---|---|---|
| CN | 101803128 A | 8/2010 |
| JP | 32-056865 A | 3/1987 |
| JP | 2000-241447 A | 9/2000 |
| JP | 3210645 B2 | 9/2001 |
| JP | 2008-546164 A | 12/2008 |
| JP | 2010-025844 A | 2/2010 |
| JP | 2010-151732 A | 7/2010 |
| JP | 2011-033410 A | 2/2011 |
| TW | 528871 B | 4/2003 |
| TW | 200730831 A | 8/2007 |
| WO | 2011046290 A2 | 4/2011 |
| WO | 2012/067077 A1 | 5/2012 |

OTHER PUBLICATIONS

International Search Report dated Oct. 13, 2015, issued for PCT/JP2015/072555.
Office Action dated Oct. 10, 2017 issued for corresponding Japanese Patent Application No. 2016-540761.
Office Action dated Nov. 15, 2017 issued for corresponding Korean Patent Application No. 10-2017-7003357.
The extended European search report dated Apr. 3, 2018 issued for corresponding European Patent Application No. 15830423.8.
Office Action dated Sep. 4, 2018 issued for corresponding Chinese Patent Application No. 201580042527.3.

* cited by examiner

CONNECTION TERMINAL

FIELD

The present invention relates to a connection terminal used in connecting electrical circuit boards and the like.

BACKGROUND

To perform a continuity check or to inspect operational characteristics of an inspection target, such as an integrated semiconductor circuit (package) or a liquid crystal panel, a probe unit that houses a plurality of contact probes, which are connection terminals, has conventionally been used to establish an electrical connection between the inspection target and a signal processing device that outputs inspection signals. As such integrated semiconductor circuits and liquid crystal panels have become highly integrated and miniaturized, having been evolved is a technology for narrowing the pitch between the contact probes so as to enable the probe unit to be used for a highly integrated and miniaturized inspection target.

Having been also disclosed is an exemplary probe unit including contact probes for electrically connecting an integrated semiconductor circuit and a circuit board, by having their ends brought into contact with an electrode of the integrated semiconductor circuit, and to an electrode of the circuit board for outputting inspection signals, respectively (see Patent Literature 1, for example).

The contact probe disclosed in Patent Literature 1 includes a first plunger that is brought into contact with the electrode of the integrated semiconductor circuit, a second plunger that is brought into contact with the electrode of the circuit board for outputting inspection signals, and a coil spring that connects the first plunger and the second plunger in an extensible and retractable manner. In the contact probe disclosed by Patent Literature 1, a first base end portion of the first plunger is housed inside a second base end portion of the second plunger having a substantially cylindrical shape, and electrical continuity is ensured by allowing the first base end portion and the second base end portion to slide with respect to each other. The first base end portion extends along the longitudinal direction of the first plunger, and the second base end portion extends along the longitudinal direction of the second plunger.

CITATION LIST

Patent Literature

Patent Literature 1: Japanese Patent No. 3210645

SUMMARY

Technical Problem

The contact probe disclosed in Patent Literature 1, however, has a disadvantage that the contact resistance does not stabilize because the first base end portion and the second base end portion are merely in sliding contact with each other. In order to stabilize the contact resistance, the diameter of the outer circumference of the first base end portion needs to be matched highly precisely with the diameter of the inner circumference of the second base end portion, and it has been difficult to manufacture and to assemble such a contact probe.

The present invention is made in consideration of the above, and an object of the present invention is to provide a connection terminal capable of stabilizing the contact resistance with a simple structure.

Solution to Problem

To solve the above-described problem and achieve the object, a connection terminal according to the present invention is a needle-shape conductive connection terminal that is extensible and compressible in a longitudinal direction, and includes: a first plunger including a first tip portion configured to contact with an electrode of a contact target, and a first base end portion extending from the first tip portion; a second plunger including a second tip portion configured to contact with an electrode of a contact target, and a second base end portion extending from the second tip portion, wherein a line passing through a central axis of the second base end portion intersects with a line passing through a central axis of the second tip portion, the second base end portion having elasticity and being configured to contact with the first base end portion; and a coil spring that is made from a winding of a wire, through which the first base end portion and the second base end portion are inserted, couples the first tip portion and the second tip portion such that the central axes of the first tip portion and the second tip portion become substantially in parallel, and is extensible and compressible in the longitudinal direction.

Moreover, a connection terminal according to the present invention includes: a first contact member configured to contact with one of two contact targets; a second contact member configured to contact with another one of the two contact targets; and a coil spring through which a part of the first contact member and a part of the second contact member are inserted, and is configured to press the first contact member and the second contact member in an axial direction, wherein the first contact member includes a first tip portion and a first base end portion, and the second contact member includes a second tip portion, and a tongue part with an inner circumference configured to contact with an outer circumference of the first base end portion.

Moreover, in the above-described connection terminal according to the present invention, a curvature radius of at least a tip side of the tongue part is smaller than a radius of the first base end portion when the first base end portion and the tongue part are not in contact.

Moreover, in the above-described connection terminal according to the present invention, the tongue part is configured to elastically contact with the first base end portion.

Moreover, in the above-described connection terminal according to the present invention, a surface of the tongue part contacting with the first base end portion has a shape following an outer circumferential surface of the first base end portion.

Moreover, a connection terminal according to the present invention is a conductive connection terminal that is extensible and compressible in a longitudinal direction, and includes: a first contact member including a first tip portion configured to contact with one electrode of a contact target, and a first base end portion; a second contact member including a second tip portion configured to contact with another electrode of the contact target, and a plurality of tongue parts configured to contact with the first base end portion; an elastic member configured to extend and compress the first contact member and the second contact member in the longitudinal direction; and a load applying unit configured to apply a load to the tongue parts in a direction bringing the tongue parts into contact with an outer circumference of the first base end portion.

Moreover, in the above-described connection terminal according to the present invention, the elastic member and the load applying unit are provided as one coil spring that is made from a winding of a wire.

Moreover, in the above-described connection terminal according to the present invention, the load applying unit is a tightening member that is any one of a coil spring, a C ring, an O ring, and a cylindrical shaped member that applies a load to the tongue parts in the direction bringing the tongue parts into contact with the outer circumference of the first base end portion.

Moreover, in the above-described connection terminal according to the present invention, each of the tongue parts is divided by a slit extending from an end of the tongue part toward the second tip portion in an axial direction of the second contact member, and the slit extends at least to a position of the tongue part at which the load is applied.

Moreover, in the above-described connection terminal according to the present invention, each of the tongue parts is divided by a slit extending from a tip of the tongue part in an axial direction of the second contact member, and the slit extends at least beyond a position of the tongue part at which the load is applied.

Moreover, in the above-described connection terminal according to the present invention, a length of each of the tongue parts in the axial direction is larger than a length by which the first contact member and the second contact member are permitted to move by sliding relatively to each other in the axial direction.

Moreover, in the above-described connection terminal according to the present invention, the second tip portion has a hollow space extending from a hollow space formed between the tongue parts, and the second contact member has a substantial U-shape in a plan view.

Moreover, in the above-described connection terminal according to the present invention, at least one of the first contact member and the second contact member has a plate-shape.

Moreover, in the above-described connection terminal according to the present invention, a cross section of the coil spring in a direction perpendicular to the longitudinal direction of the wire has a rectangular shape.

Moreover, in the above-described connection terminal according to the present invention, the coil spring is made of an insulating material, or a conductive material applied with insulation.

Moreover, a connection terminal according to the present invention is a conductive connection terminal that is extensible and compressible in a longitudinal direction, and includes: a first contact member including a first tip portion configured to contact with an electrode of a contact target, and a first base end portion including a plurality of branch portions extending in directions separating from each other with respect to the first tip portion; a second contact member including a second tip portion configured to contact with an electrode of a contact target, and a second base end portion having a cylindrical shape and configured to contact with the branch portions, and a coil spring configured to support the first contact member and the second contact member in an extensible and compressible manner along the longitudinal direction.

Advantageous Effects of Invention

According to the present invention, the contact resistance can be stabilized with a simple structure, advantageously.

DESCRIPTION OF EMBODIMENTS

Figure 1:
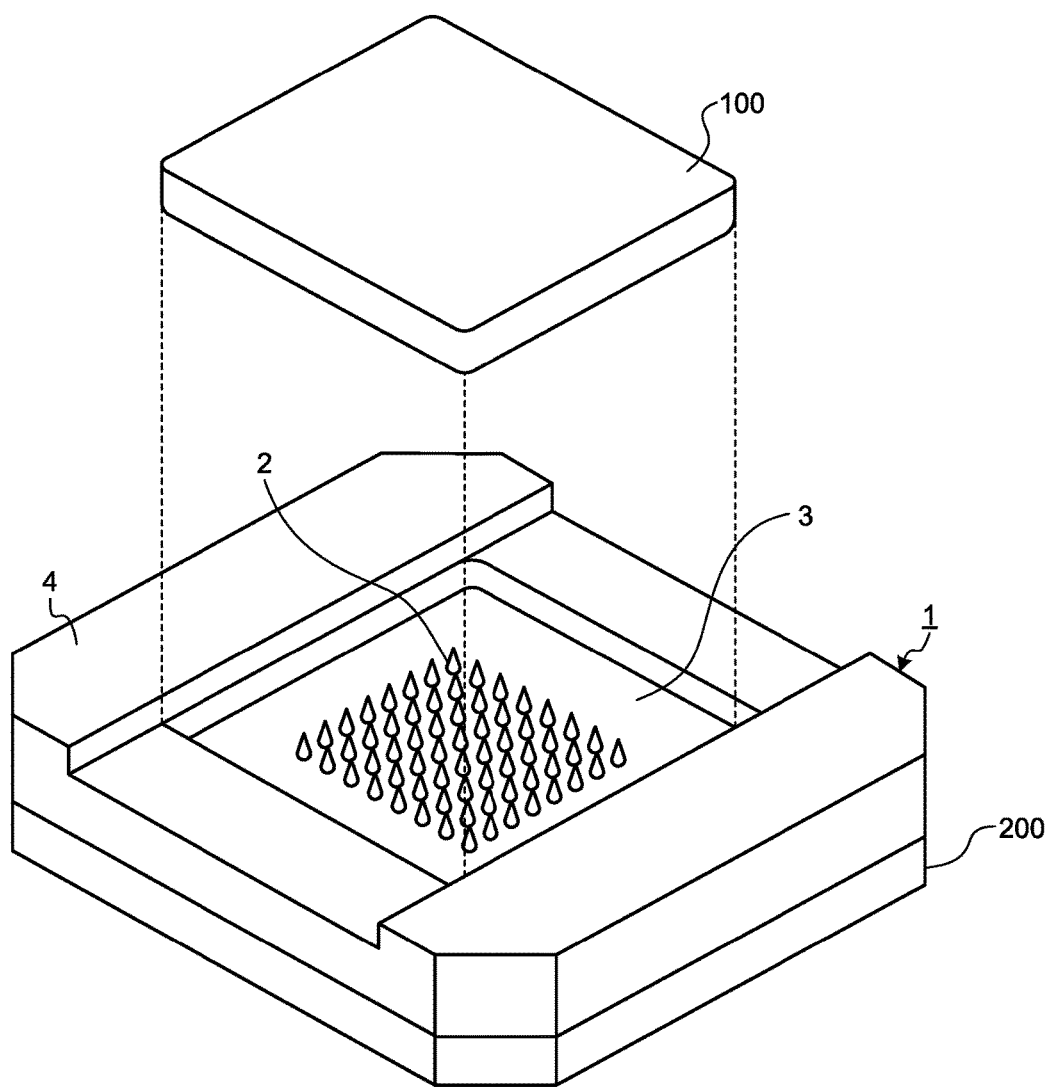
FIG. 1 is a perspective view illustrating a structure of a probe unit according to a first embodiment of the present invention.

Some embodiments of the present invention will now be explained in detail with reference to some drawings. The embodiments are, however, not intended to limit the present invention in any way. The drawings referred in the explanation below merely give schematic representations of shapes, sizes, and positional relations, to an extent facilitating understanding of the present invention. In other words, the present invention is not limited to the shapes, the sizes, and the positional relations illustrated in the drawings.

First Embodiment

FIG. 1 is a perspective view illustrating a structure of a probe unit according to a first embodiment of the present invention. This probe unit 1 illustrated in FIG. 1 is a device that is used in inspecting the electrical characteristics of an integrated semiconductor circuit 100 that is an inspection target, and is a device that electrically connects the integrated semiconductor circuit 100 and a circuit board 200 outputting inspection signals to the integrated semiconductor circuit 100.

The probe unit 1 includes conductive contact probes 2 (hereinafter, simply referred to as "probes 2") each having their ends, in a longitudinal direction (axis N0), brought into contact with the electrode of the integrated semiconductor circuit 100 and the electrode of the circuit board 200, which are two different bodies to be brought into contact, respectively, a probe holder 3 that houses therein and holds a plurality of probes 2 in a predetermined pattern, and a holder member 4 that is provided around the probe holder 3, and that suppresses the displacement of the integrated semiconductor circuit 100 to be brought into contact with the probes 2 during the inspection. The probe 2 corresponds to the connection terminal according to the present invention.

Figure 2:
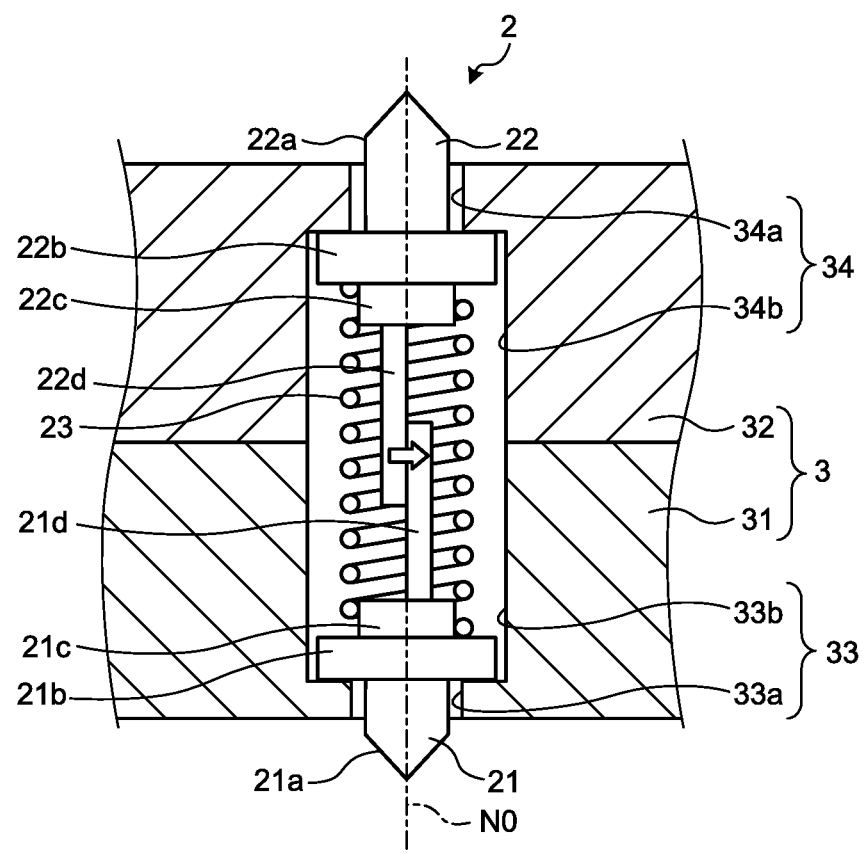
FIG. 2 is a partial sectional view illustrating a structure of a relevant portion of the probe unit according to the first embodiment.

FIG. 2 is a partial cross-sectional view illustrating a structure of a relevant portion of the probe unit according to the first embodiment, and is a schematic illustrating a structure of a probe 2 housed in the probe holder 3, in detail. The probe 2 illustrated in FIG. 2 is made of a conductive material and includes a first plunger 21 that is brought into contact with the electrode of the circuit board 200 having an inspection circuit, a second plunger 22 that is made of a conductive material and is brought into contact with a connecting electrode of the integrated semiconductor circuit 100, both plungers of which are brought into contact with the respective electrodes during the inspection of the integrated semiconductor circuit 100, and a coil spring 23 that is disposed between the first plunger 21 and the second plunger 22, and that couples the first plunger 21 and the second plunger 22 in an extensible and compressible manner. Because the coil spring 23 extends and becomes compressed in the axial direction, when the integrated semiconductor circuit 100 is brought into contact with the probe 2, the probe 2 alleviates the shock applied to the connecting electrode of the integrated semiconductor circuit 100, and applies a load onto the integrated semiconductor circuit 100 and the circuit board 200.

Figure 3:
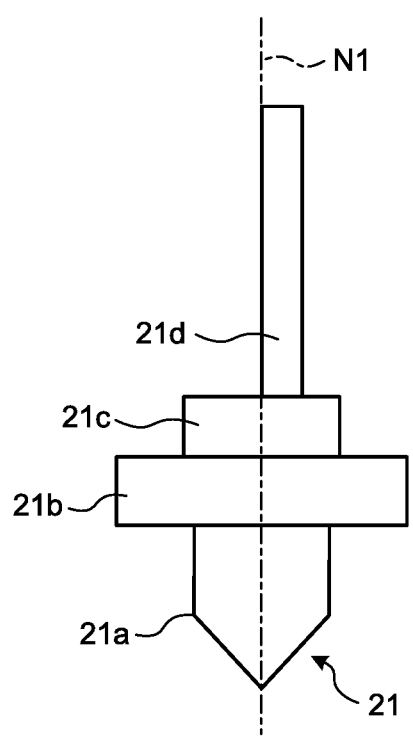
FIG. 3 is a schematic illustrating a structure of a relevant portion of the contact probe according to the first embodiment.

FIG. 3 is a schematic illustrating a structure of a relevant portion of the contact probe according to the first embodiment, and is a schematic illustrating a structure of the first plunger 21. The first plunger 21 includes a tip portion 21a having a tapered pointed shape, a flange portion 21b extending from the base end side of the tip portion 21a and having a diameter larger than that of the tip portion 21a, a boss 21c extending from an end of the flange portion 21b on the side opposite to the side continuous to the tip portion 21a, and having a diameter larger than that of the flange portion 21b, and a base end portion 21d extending from an end of the boss 21c on the side opposite to the side continuous to the flange portion 21b, and extending in a semicircular columnar shape with a width smaller than the diameter of the boss 21c. In the first embodiment, the tip portion 21a, the flange portion 21b, and the boss 21c serve as a first tip portion, and the base end portion 21d serves as a first base end portion.

The tip portion 21a, the flange portion 21b, and the boss 21c of the first plunger 21 are coaxially positioned (along axis N1), and the base end portion 21d extends along the axis N1.

Figure 4:
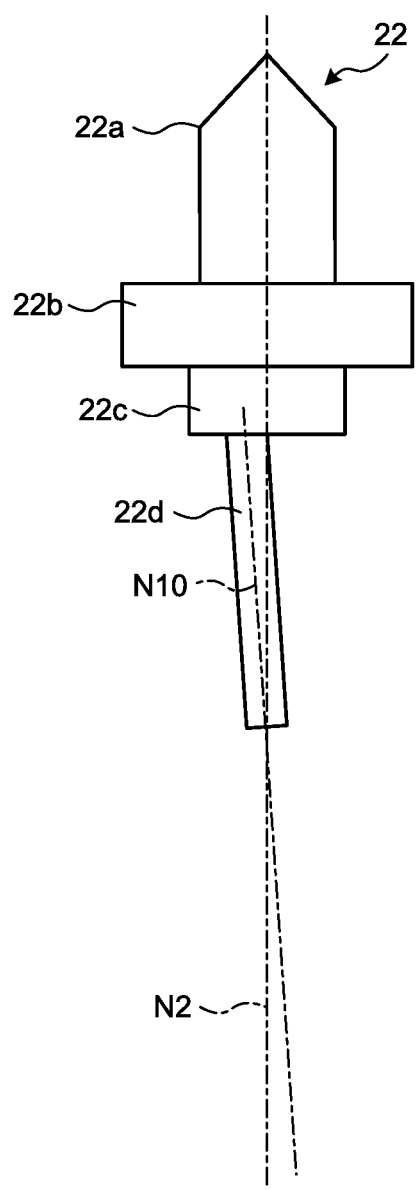
FIG. 4 is a schematic illustrating a structure of a relevant portion of the contact probe according to the first embodiment.

FIG. 4 is a schematic illustrating a structure of a relevant portion of the contact probe according to the first embodiment, and is a schematic illustrating a structure of the second plunger 22. The second plunger 22 includes a tip portion 22a having a tapered pointed shape, a flange portion 22b extending from the base end side of the tip portion 22a and having a diameter larger than that of the tip portion 22a, a boss 22c extending from an end of the flange portion 22b on the side opposite to the side continuous to the tip portion 22a, and having a diameter larger than that of the flange portion 22b, and a base end portion 22d extending from an end of the boss 22c that is on the side opposite to the side continuous to the flange portion 22b, and extending in a flat plate shape with a width smaller than the diameter of the boss 22c. In the second plunger 22, at least the base end portion 22d is elastic. In the first embodiment, the tip portion 22a, the flange portion 22b, and the boss 22c serve as a second tip portion, and the base end portion 22d serves as a second base end portion.

The tip portion 22a, the flange portion 22b, and the boss 22c of the second plunger 22 are coaxially positioned (axis N2), and the axis N10 of the direction in which the base end portion 22d extends (central axis) intersects with the axis N2.

The coil spring 23 is made from a wire wound at a predetermined pitch, and at least the base end portions 21d, 22d are inserted into the coil spring 23. The coil spring 23 is coupled in such a manner that, when the first plunger 21 and the second plunger 22 are coupled, the axis N1 of the first plunger 21 is substantially matched with the axis N2 of the second plunger 22. In other words, the first plunger 21 and the second plunger 22 are coupled in such a manner that the axis N1 and the axis N2 are coaxially aligned with respect to the axis N0, by the coil spring 23. The coil spring 23 may be joined with any one or both of the first plunger 21 and the second plunger 22, by soldering. The wire used for the coil spring 23 may be made of a material such as a metal or a resin. Such a material may be conductive or insulating, or may be a conductive material having applied with insulation.

The first plunger 21 and the second plunger 22 are movable in the axial direction by the effect of extension and compression of the coil spring 23. When the probe 2 is held in the probe holder 3, with no external load (except for the gravity) applied to the probe 2 (see FIG. 2), the base end portion 22d of the second plunger 22 is partly brought into contact with the base end portion 21d of the first plunger 21. Specifically, because the axis N10 of the base end portion 22d is inclined with respect to (intersects with) the axis N2, as illustrated in FIG. 4, the base end portion 22d is held in a manner pressed against the base end portion 21d (with a load applied to the base end portion 21*d* in a direction substantially perpendicular to the axis N0).

The probe holder 3 is made of an insulating material such as a resin and a machinable ceramic, and the positions at which the holder holes 33 and 34 are provided are determined based on the wiring pattern of the integrated semiconductor circuit 100.

Figure 5:
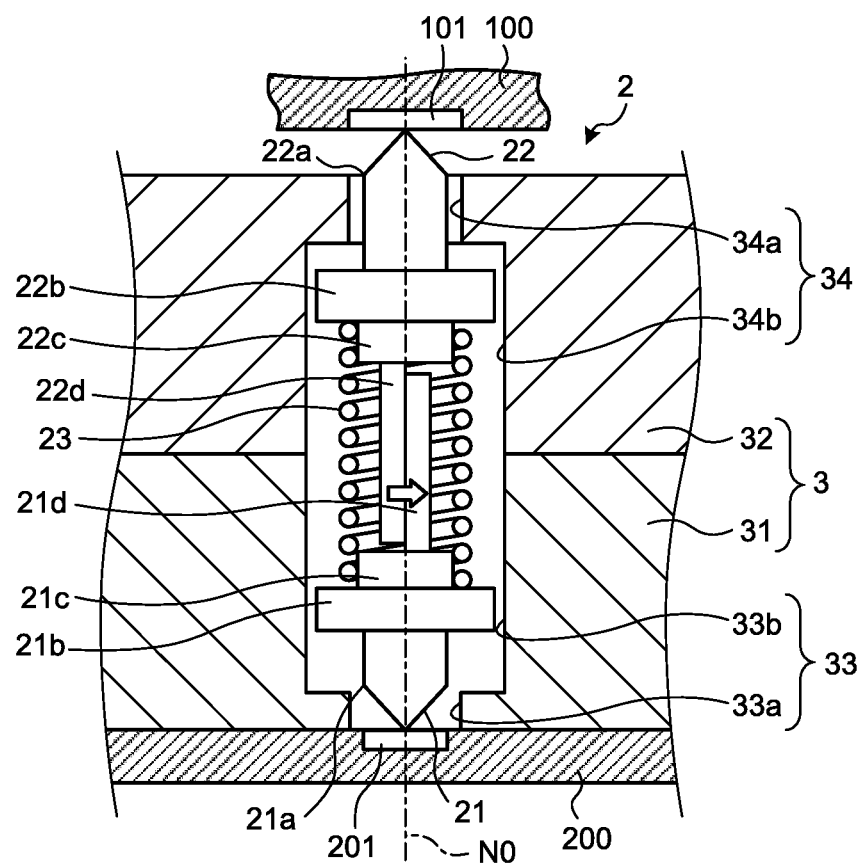
FIG. 5 is a partial cross-sectional view illustrating a structure of a relevant portion of the probe unit during the inspection of a semiconductor package in the first embodiment, and illustrating a configuration in which the contact probe is connected with the circuit board and the semiconductor package.

FIG. 5 is a partial cross-sectional view illustrating a structure of a relevant portion of the probe unit according to the first embodiment during the inspection of a semiconductor package unit, and illustrates a configuration in which the contact probe is connected with the circuit board and the semiconductor package. When the circuit board 200 is mounted on the holder member 4 (see FIG. 1), the tip portion 21*a* is brought into contact with an electrode 201 of the circuit board 200, as illustrated in FIG. 5. When the contact load from the circuit board 200 is applied onto the tip portion 21*a*, as a result of this contact, the coil spring 23 becomes compressed in the longitudinal direction. When the coil spring 23 becomes compressed, the first plunger 21 and the second plunger 22 move in the direction approaching each other, the base end portion 22*d* slides on the contact surface of the base end portion 21*d*, while being pressed against the contact surface and applying a load in the radial direction (in the direction of the arrow in FIG. 2, for example).

When the integrated semiconductor circuit 100 is to be inspected, the tip portion 22*a* is brought into contact with a connecting electrode 101, and the coil spring 23 becomes further compressed in the longitudinal direction (along the axis N0), as a result of the contact load from the integrated semiconductor circuit 100. When the coil spring 23 becomes compressed, the base end portion 22*d* slides further on the contact surface of the base end portion 21*d*, while being pressed against the contact surface.

According to the first embodiment described above, in the second plunger 22, the elastic base end portion 22*d*, having the axis N10 with its extending direction intersecting with the axis N2 in an inclined manner, slides against the base end portion 21*d* extending along the axis N1. Therefore, while the inspection signals are conducted via the probe, the pressure at which the base end portion 21*d* and the base end portion 22*d* is held in contact each other can be increased, the contact can be stabilized, and the contact resistance between the plungers can be stably reduced with a simple structure, and the resistance of the probe (the entire probe) can be reduced.

According to the first embodiment described above, because electrical continuity between the first plunger 21 and the second plunger 22 is ensured via the base end portion 21*d* and the base end portion 22*d*, without conducting any current to the coil spring 23, application of a high current becomes possible.

Explained in the first embodiment above is an example in which at least the base end portion 22*d* is elastic, but the second plunger 22 may also be integrally formed (made of the same material), or an elastic material may be used only for the base end portion 22*d*. The elasticity of the base end portion 22*d* may be quite small, such as that of the spring-back of a metal, with no limitation to the scale of the elasticity, as long as the elasticity can bring the contact surfaces into contact with each other with some pressure applied to the contact surfaces.

Furthermore, explained in the first embodiment above is an example in which the connecting electrode has a flat plate shape, but the connecting electrode may be a lead having a flat plate shape, such as those used in a quad flat package (QFP).

Modification of First Embodiment

Figure 6:
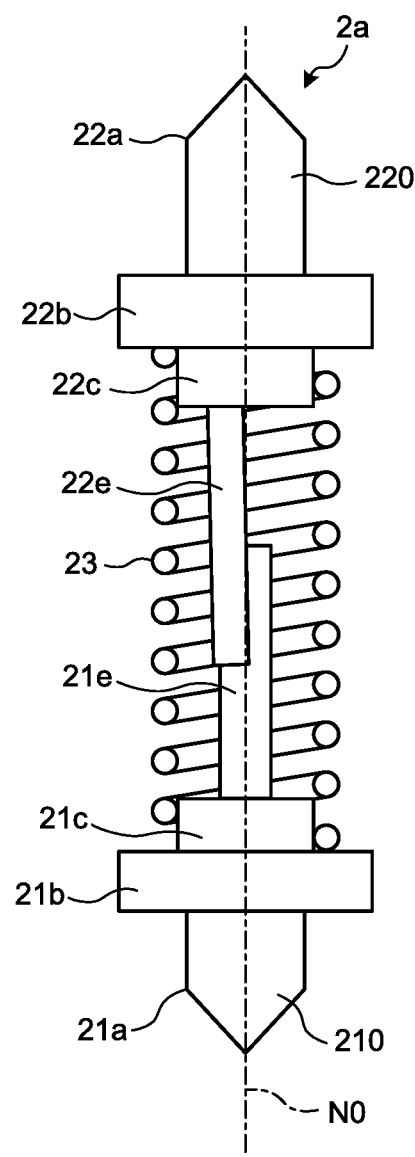
FIG. 6 is a partial sectional view illustrating a structure of a contact probe according to a modification of the first embodiment.

FIG. 6 is a partial sectional view illustrating a structure of a contact probe according to a modification of the first embodiment. Explained in the first embodiment above is an example in which the base end portions 21*d*, 22*d* have a flat plate shape, but in this modification, each of the base end portions of the first plunger and the second plunger has a shape corresponding to the contact surface of the other.

A probe 2*a* illustrated in FIG. 6 includes a first plunger 210 that is made of a conductive material and that is brought into contact with the electrode of the circuit board 200, a second plunger 220 that is made of a conductive material and that is brought into contact with the connecting electrode of the integrated semiconductor circuit 100, and the coil spring 23 that is disposed between the first plunger 210 and the second plunger 220, and that couples the first plunger 210 and the second plunger 220 in an extensible and compressible manner. The first plunger 210, the second plunger 220, and the coil spring 23 included in the probe 2*a* share the same axial line.

Figure 7:
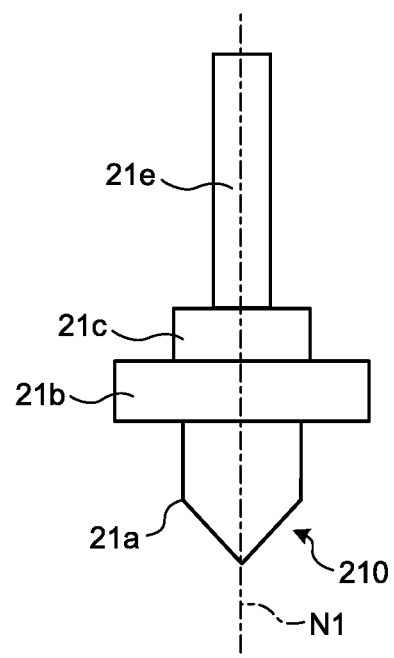
FIG. 7 is a schematic illustrating a structure of a relevant portion of the contact probe according to the modification of the first embodiment.

FIG. 7 is a schematic illustrating a structure of a relevant portion of the contact probe according to the modification of the first embodiment, and is a schematic illustrating a structure of the first plunger 210. The first plunger 210 according to the modification has a base end portion 21*e* extending in a cylindrical shape, instead of the base end portion 21*d* of the first plunger 21 described above.

Figure 8:
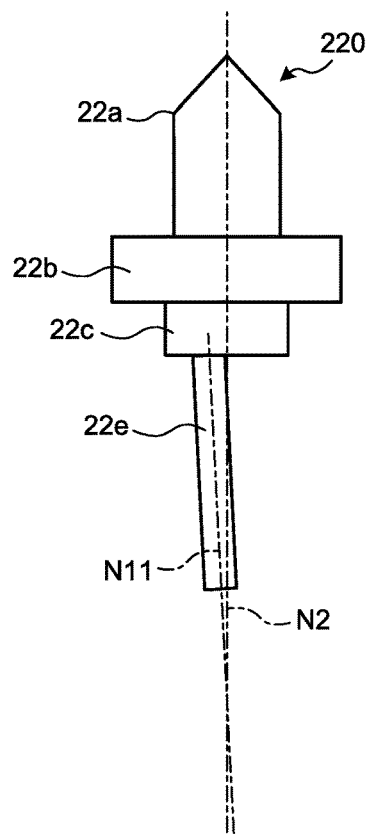
FIG. 8 is a schematic illustrating a structure of a relevant portion of the contact probe according to the modification of the first embodiment.
Figure 9:
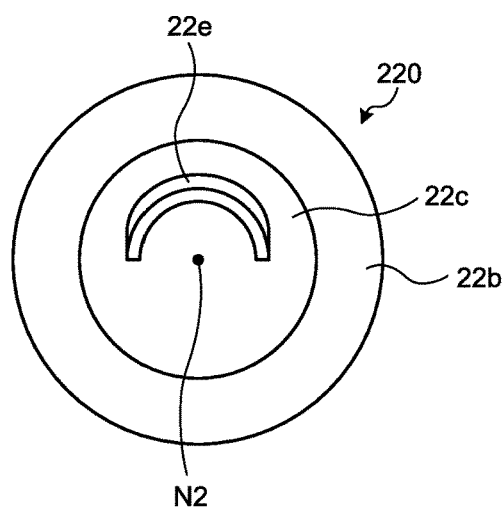
FIG. 9 is a schematic illustrating a structure of a relevant portion of the contact probe according to the modification of the first embodiment.

FIG. 8 is a schematic illustrating a structure of a relevant portion of a contact probe according to the modification of the first embodiment, and is a schematic illustrating a structure of the second plunger 220. FIG. 9 is a schematic illustrating a structure of a relevant portion of the contact probe according to the modification of the first embodiment, and giving a view of the second plunger 220 seen from the side of the base end portion 22*e*, along the direction of the axis N2. The second plunger 220 includes the tip portion 22*a*, the flange portion 22*b*, and the boss 22*c* that are described above, and a base end portion 22*e* (second base end portion) extending from an end of the boss 22*c* that is on the side opposite to the side continuous to the flange portion 22*b*. In the second plunger 220, at least the base end portion 22*e* is elastic. The base end portion 22*e* serves as a tongue part according to the present invention.

In the second plunger 220, an axis N11 (central axis) of the extending direction of the base end portion 22*e* intersects with the axis N2 extending in parallel at least with the central axis of the tip portion 22*a*. The axis N11 is a line passing through the center of gravity of the base end portion 22*e*, and extending in parallel with the extending direction of the base end portion 22*e*, for example.

The base end portion 22*e* has an inner circumferential surface having a rounded shape that is substantially the same as the rounded shape of the outer circumference of the base end portion 21*e*. Specifically, the base end portion 22*e* has a shape of a flat plate curved in a direction perpendicular to the axis N11, and the curved rounded shape (curvature) is the same as the rounded shape (curvature) of the outer circumferential side surface of the base end portion 21*e*.

The first plunger 210 and the second plunger 220 are movable in the axial direction by the effect of extension and compression of the coil spring 23. In the same manner as in the first embodiment, because the axis N11 of the base end portion 22*e* is inclined with respect to (intersects with) the axis N2, the base end portion 22*e* is held in a manner pressed against the base end portion 21*e* (with a load applied to the base end portion 21*e* in a direction substantially perpendicular to the axis N0). When the coil spring 23 becomes compressed by an external load, the base end portion 22e slides on the contact surface of the base end portion 21e, while elastically being brought into contact with the contact surface.

Explained in the modification above is an example in which the rounded shape (curvature) of the inner circumferential surface of the base end portion 22e is the same as the rounded shape (curvature) of the outer circumferential side surface of the base end portion 21e, but the curvature radius of at least an end side of the inner circumferential surface of the base end portion 22e may be smaller than the radius of the outer circumference of the base end portion 21e, while the base end portion 21e is not in contact with the base end portion 22e. When the curvature radius of the inner circumferential surface of the base end portion 22e is smaller than the radius of the outer circumference of the base end portion 21e, the base end portion 22e becomes engaged with and is brought into contact with the outer circumference of the base end portion 21e when the base end portion 21e and the base end portion 22e are brought into contact with each other. In this manner, the base end portion 21e and the base end portion 22e can be brought into contact with each other, and pressed against with each other more firmly.

Second Embodiment

Figure 10:
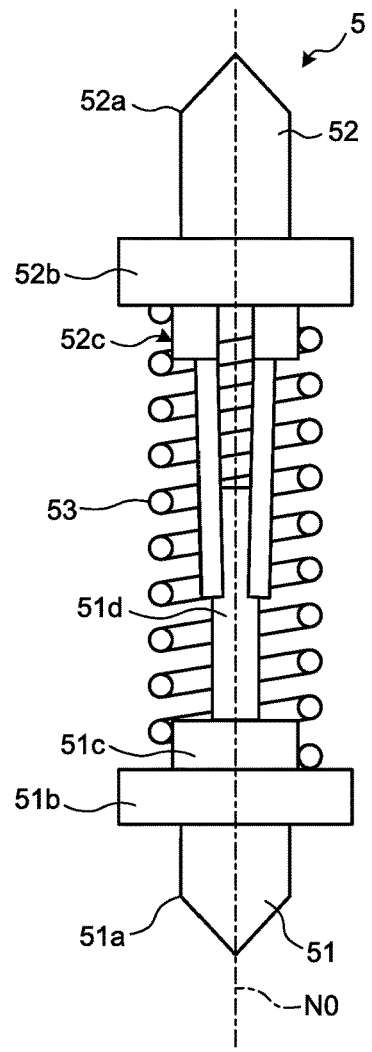
FIG. 10 is a partial sectional view illustrating a structure of a contact probe according to a second embodiment of the present invention.

FIG. 10 is a partial sectional view illustrating a structure of a contact probe according to a second embodiment of the present invention. Explained in the first embodiment above is an example in which one base end portion is pressed against the other base end portion, but, in a probe 5 according to the second embodiment, one base end portion surrounds a part of the other base end portion.

The probe 5 according to the second embodiment is made of a conductive material, and includes a first plunger 51 that is made of a conductive material and that is brought into contact with the electrode of the circuit board 200 having the inspection circuit, and a second plunger 52 that is brought into contact with the connecting electrode of the integrated semiconductor circuit 100, both plungers being brought into contact with the respective electrodes during the inspection of the integrated semiconductor circuit 100 (see FIG. 1), and a coil spring 53 that is interposed between the first plunger 51 and the second plunger 52, and that couples the first plunger 51 and the second plunger 52 in an extensible and compressible manner. The first plunger 51, the second plunger 52, and the coil spring 53 included in the probe 5 share the same axial line. The coil spring 53 has a function of an elastic member and a load applying unit according to the present invention.

The first plunger 51 has the same shape as the first plunger 210 described above, and includes a tip portion 51a having the same shape as, a flange portion 51b, a boss 51c, and a base end portion 51d having the same shapes as the tip portion 21a, the flange portion 21b, the boss 21c, and the base end portion 21e, respectively. The coil spring 53 also has the same shape as the coil spring 23 described above.

The second plunger 52 includes a tip portion 52a having a tapered pointed shape, a flange portion 52b extending from the base end side of the tip portion 52a and having a diameter larger than that of the tip portion 52a, a tongue part group 52c that includes a plurality of tongue parts (a first tongue part 521 and a second tongue part 522) extending from an end of the flange portion 52b on the side opposite to the side continuous to the tip portion 52a, and surrounding the base end portion 51d, all of which are coaxially positioned (along the axis N0). In the second plunger 52, at least the tongue part group 52c is elastic.

Figure 11:
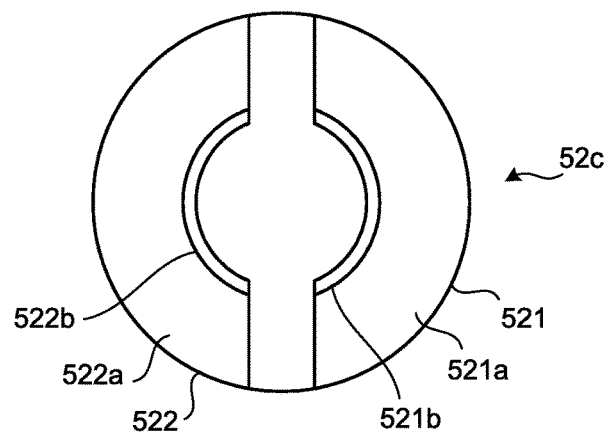
FIG. 11 is a schematic illustrating a structure of a relevant portion of the contact probe according to the second embodiment.

FIG. 11 is a schematic illustrating a structure of a relevant portion of the contact probe according to the second embodiment, giving a view of the second plunger 52 seen from the side of the tip portion of the tongue part group 52c in the direction of the axis N0. The largest part of the diameter formed by the outer perimeter of the two tongue parts, which are the first tongue part 521 and the second tongue part 522, is smaller than the diameter of the flange portion 52b. The diameter formed by the inner perimeter of the two tongue parts may be equal to, smaller, or larger than the diameter of the outer circumference of the base end portion 51d, as long as the tongue parts is brought into contact with the first base end portion with slight elasticity, once the probe is assembled. Explained in the second embodiment is an example in which the tongue part group 52c has two tongue parts, but the tongue part group 52c may include three or more tongue parts.

It is preferable for each of the first tongue part 521 and the second tongue part 522 to have a stepped shape, and to be rotationally symmetric about the axis N0 serving as the rotational axis, from the viewpoint of controlling the inclination of the second plunger 52 with respect to the first plunger 51. Specifically, the first tongue part 521 includes a first boss 521a that extends from an end of the flange portion 52b on the opposite side of the side continuing to the tip portion 52a, and a first extending portion 521b that extends from the first boss 521a, extending in a manner following the inner perimeter of the first boss 521a, and that has a thickness smaller than the thickness of the first boss 521a in a direction perpendicular to the axis N0. The second tongue part 522 includes a second boss 522a and a second extending portion 522b, in the same manner as the first tongue part 521. The inner circumferential surfaces of the first extending portion 521b and the second extending portion 522b surround a part (tip side) of the base end portion 51d. It is preferable for the inner circumferential surfaces of the first tongue part 521 and the second tongue part 522 to form a shape following the outer circumferential surface of the base end portion 51d. By providing the inner circumferential surfaces of the first tongue part 521 and the second tongue part 522 with a shape following the outer circumference of the base end portion 51d, the contact resistance can be reduced. The first tongue part 521 and the second tongue part 522 are manufactured by drilling a hole with a drill having a diameter that is based on the size of the base end portion 51d, and forming a groove with a rotary cutter or the like, forming two separate tongue parts thereby, for example.

The coil spring 53 couples the first plunger 51 and the second plunger 52 by being press-fitted onto the outer perimeter of the first boss 521a and the second boss 522a, and onto the boss 51c.

The first boss 521a and the second boss 522a are tightened by press-fitting the coil spring 53, so that the diameter of the outer perimeter becomes reduced. When the diameter of the outer perimeter of the first boss 521a and the second boss 522a becomes reduced, the first extending portion 521b and the second extending portion 522b are also moved toward the side of the inner circumference. In this manner, the diameter formed by the inner circumferential surfaces of the first extending portion 521b and the second extending portion 522b is also reduced. Therefore, the first extending portion 521b and the second extending portion 522b become pressed against the outer circumference of the base end portion 51d. The first tongue part 521 and the second tongue part 522 are formed by providing a slit to the tongue part group 52c. This slit extends from an end of the tongue part group 52c on the side opposite to the flange portion 52b at least to the position tightened by the coil spring 53 (position at which the load is applied by the coil spring 53).

The first plunger 51 and the second plunger 52 are movable in the axial direction by the effect of extension and compression of the coil spring 53. The first extending portion 521b and the second extending portion 522b are held in a manner pressed against the base end portion 51d, by the tightening force of the coil spring 53 (with the load applied to the base end portion 51d in a direction substantially perpendicular to the axis N0). When the coil spring 53 becomes compressed by the external load, the first extending portion 521b and the second extending portion 522b slide on the contact surface of the base end portion 51d, while being pressed against the contact surface.

The second plunger 52 can be formed by forming the tip portion, the flange, the boss, and the base end portion, in the same manner as those in the first plunger 51, and by cutting the boss and the extending portion with a drill or a cutter. When the second plunger 52 is manufactured as one part using the method described above, the second plunger 52 is made with a conductive material having some elasticity.

Figure 12:
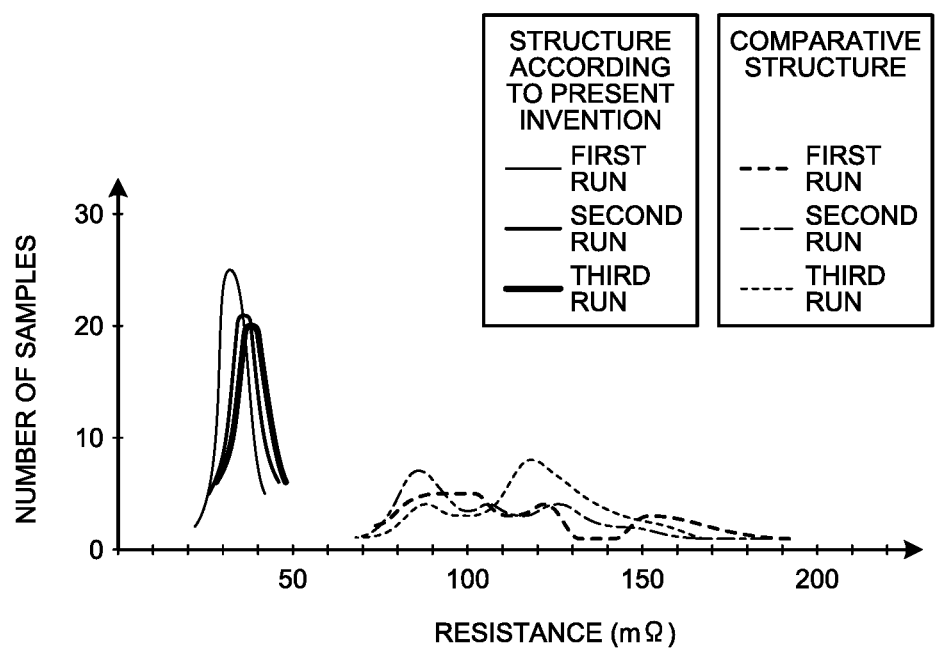
FIG. 12 is a distribution chart illustrating a distribution of the numbers of test samples of the contact probe according to the second embodiment and those having a comparative structure that is a conventional structure, with respect to resistance.

FIG. 12 is a distribution chart illustrating a distribution of the numbers of test samples of the contact probe according to the second embodiment and those having a comparative structure that is a conventional structure, with respect to the resistance. In the distribution chart illustrated in FIG. 12, the vertical axis represents the number (number of test samples), and the horizontal axis represents the resistance, and the distribution chart indicates the distribution of the probes 5 in which the first boss 521a and the second boss 522a are tightened by press-fitting the coil spring 53 (the structure according to the present invention), and the comparative probes (with a comparative structure) without tightening of the coil spring 53. For the test, thirty-two samples were prepared, for each of the probes having such a structure described above, and a measurement was collected three times for each probe. In the test, the stroke of the first plunger and the second plunger is set to 500 μm.

As illustrated in FIG. 12, the structure according to the present invention exhibited a low resistance, and the resistances were less scattered, compared with the comparative structure. The average resistance of the structure according to the present invention was 33.6 mΩ for the first run, 34.7 mΩ for the second run, and 35.0 mΩ for the third run. The average resistance of the comparative structure was 111.5 mΩ for the first run, 108.0 mΩ for the second run, and 115.0 mΩ for the third run. In this manner, by providing a probe with a structure in which the extending portions are pressed against the contact surface by tightening of the coil spring 53, in the manner as in the structure according to the present invention, a probe with low resistance and with less variation among the probes can be achieved.

According to the second embodiment described above, because, in the second plunger 52, the first extending portion 521b and the second extending portion 522b, being pressed against the base end portion 51d by the tightening force of the coil spring 53, are configured to slide, the pressure at which the tongue part group 52c (the first tongue part 521b and the second tongue part 522b) contact the base end portion 51d can be increased, and the contact can be stabilized, the contact resistance between the plungers can be stably reduced with a simple structure, and the resistance of the probe (the entire probe) can be reduced.

Furthermore, according to the second embodiment described above, because the area of the base end portion 51d that is brought into contact with the first extending portion 521b and the second extending portion 522b is increased, compared with the structure according to the first embodiment, the current to be conducted can be further increased.

In the second embodiment described above, the length of the tongue parts in the axial direction is preferably larger than the length by which the first plunger 51 and the second plunger 52 is allowed to move by sliding relatively with each other in the axial direction. When the length of the tongue parts in the axial direction is extended, the force by which the first plunger 51 is tightened is reduced, because of a relation with the moment force, and the sliding friction is reduced. Therefore, a moderate frictional force can be generated without increasing the sliding frictional resistance. Furthermore, because, when the length of the tongue parts is extended, the bending stress on the ends of the tongue parts on the side of the tightened portion (the first boss 521a and the second boss 522a) is reduced, so that the thickness of the tongue parts can be reduced, and the requirement for reducing the diameter of the second plunger 52 can be easily satisfied.

Explained in the second embodiment above is an example in which the tongue part group 52c includes two tongue parts (the first tongue part 521 and the second tongue part 522), but the tongue part group 52c may also include three or more tongue parts. For example, in a configuration in which the tongue part group includes three tongue parts, by setting the shape delineated by the inner circumferential surface of the tongue parts to a shape following the outer circumferential surface of the base end portion 51d, sliding can be further stabilized, compared with a configuration in which the tongue part group includes two tongue parts.

Furthermore, in the second embodiment described above, the first plunger 51 may be supported by the coil spring 53, by press-fitting and coupling the boss 51c into and with the coil spring 53, or by providing the boss 51c with a diameter larger than that of the inner diameter of the coil spring 53 so that the coil spring 53 abuts against the flange portion 51b and supports the first plunger 51.

First Modification of Second Embodiment

Figure 13:
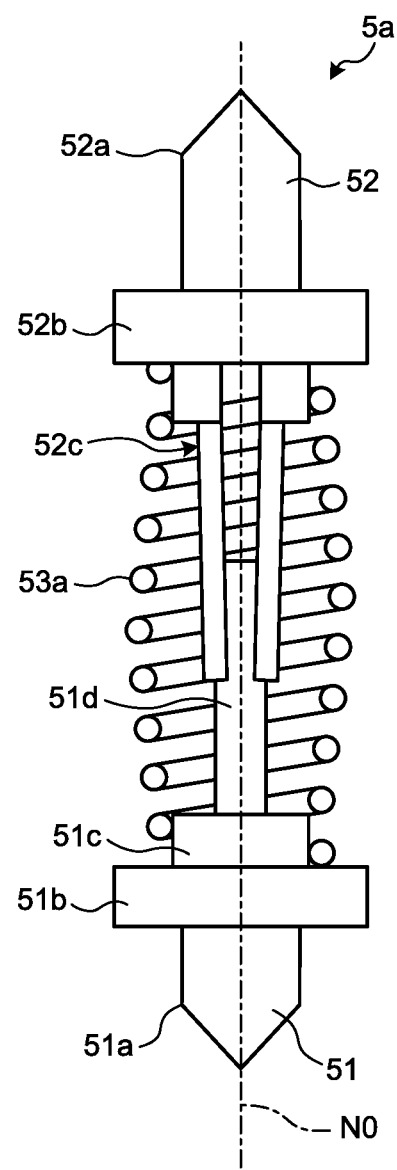
FIG. 13 is a partial sectional view illustrating a structure of a contact probe according to a first modification of the second embodiment.

FIG. 13 is a partial sectional view illustrating a structure of a contact probe according to a first modification of the second embodiment. Explained in the second embodiment is an example in which the coil diameter of the winding of the wire making up the coil spring 53 is constant, but, in the first modification, the coil diameter is changed. The diameters at both ends of the coil are smaller than the diameter at the center, so that the coil can be press-fitted more strongly compared with the second embodiment described above.

A probe 5a according to the first modification includes the first plunger 51 and the second plunger 52 described above, and a coil spring 53a. The coil diameter of one end of the coil spring 53a is set equal to or smaller than the diameter of the outer perimeter of the press-fitted portion of the tongue part group 52c (the first boss 521a and a second boss 522a), and the coil diameter of the other end is equal to or smaller than the diameter of the base end portion 51d.

Second Modification of Second Embodiment

Figure 14:
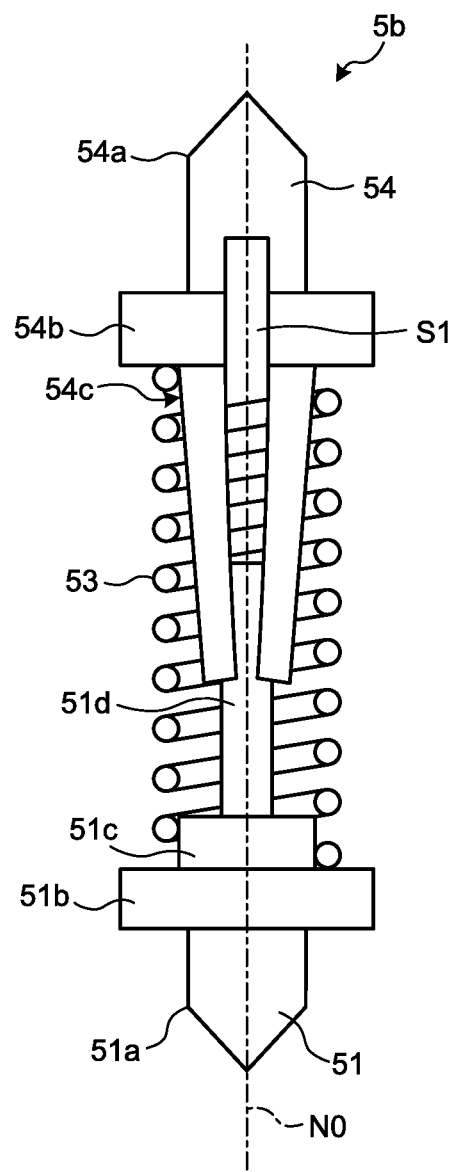
FIG. 14 is a partial sectional view illustrating a structure of a contact probe according to a second modification of the second embodiment.
Figure 15:
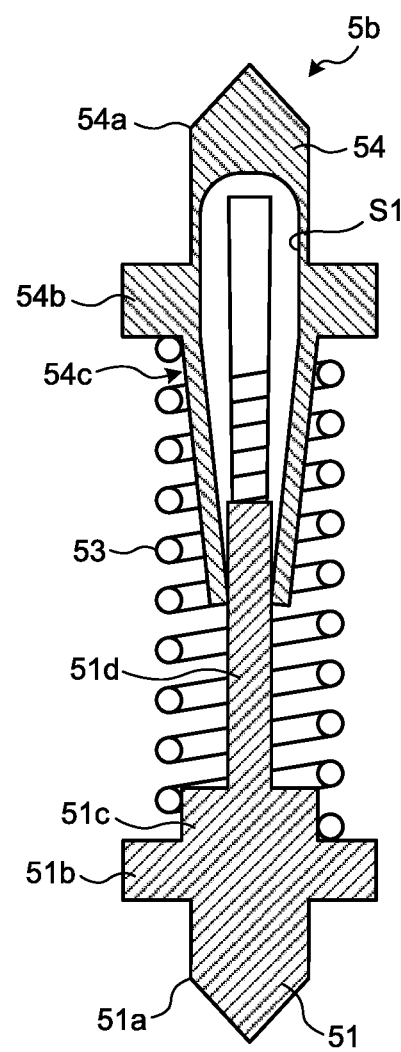
FIG. 15 is a cross-sectional view illustrating the structure of the contact probe according to the second modification of the second embodiment.

FIG. 14 is a partial sectional view illustrating a structure of a contact probe according to a second modification of the second embodiment. FIG. 15 is a cross-sectional view illustrating a structure of the contact probe according to the second modification of the second embodiment. FIG. 15 is a cross-sectional view of the contact probe, sectioned across a plane passing through the axis N0 illustrated in FIG. 14. In the second modification, a cut-out groove is provided to the tip portion and the flange of the second plunger, in a manner corresponding to the space (slit) formed between the tongue parts.

A probe 5b according to the second modification includes the first plunger 51 and the coil spring 53 described above, and a second plunger 54. The second plunger 54 includes a tip portion 54a having a tapered pointed shape, a flange portion 54b extending from the base end side of the tip portion 54a and having a diameter larger than that of the tip portion 54a, a tongue part group 54c including a plurality of tongue parts and extending from an end of the flange portion 54b on the opposite side of the side continuing to the tip portion 54a, all of which are coaxially positioned (axis N0).

The tongue parts extend from the flange portion 54b in the direction along the axis N0, and extend in such a manner that the distance between the facing tongue parts becomes smaller toward the tip. In other words, the diameter of the substantial circle delineated by the outer perimeter (outer circumference) of the tongue parts becomes smaller toward the tip in the extending direction. The diameter may be kept not reduced, if the second plunger 54 can be pressed by the tongue parts against the base end portion 51d.

A hollow S1 is provided in the tip portion 54a and the flange portion 54b, correspondingly to the internal space formed by the tongue parts. Also extending in the second plunger 54 from an end of the tongue part group 54c on the opposite side of the flange portion 54b in the axial direction of the second plunger 54 is a slit by which the internal space formed by the tongue parts and the hollow S1 is communicated to the external. The tongue parts of the tongue part group 54c are defined by the slit. This slit extends from an end of the tongue part group 54c on the opposite side of the flange portion 54b to a position beyond where the tongue parts are tightened at least by the coil spring 53 (the position to which the load is applied by the coil spring 53). In other words, the slit extends into the tip portion 54a and the flange portion 54b. By forming the hollow S1 and reducing the rigidity of the tip portion 54a and the flange portion 54b, when the tongue part group 54c is tightened by press-fitting the coil spring 53, the tongue part group 54c can be bent by a greater degree, and a larger load can be applied to the base end portion 51d (the load resulting from being pressed). The hollow S1, too, can be formed with a drill or a cutter (blade tool), as mentioned earlier.

Third Modification of Second Embodiment

Figure 16:
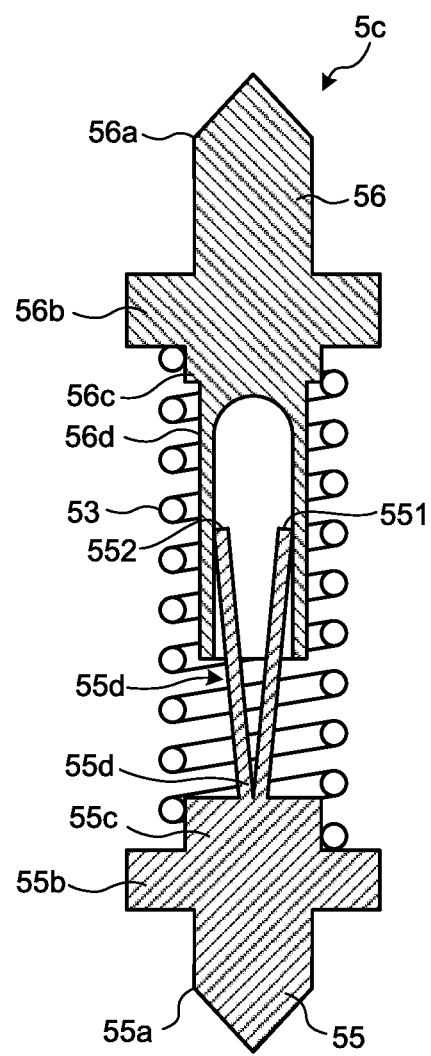
FIG. 16 is a cross-sectional view illustrating a structure of a contact probe according to a third modification of the second embodiment.

FIG. 16 is a cross-sectional view illustrating a structure of a contact probe according to a third modification of the second embodiment. Explained in the second embodiment is an example in which the base end portion 51d has a cylindrical shape, but, in the third modification, the base end portion has a V-shape, resultant of dividing the cylinder into two, and branching the two to two directions.

A probe 5c according to the second modification includes the coil spring 53 described above, a first plunger 55, and a second plunger 56. The first plunger 55 includes a tip portion 55a having a tapered pointed shape, a flange portion 55b extending from the base end side of the tip portion 55a and having a diameter larger than that of the tip portion 55a, a boss 55c extending from an end of the flange portion 55b on the opposite side of a side continuing to the tip portion 55a, and having a diameter smaller than that of the flange portion 55b, and a base end portion 55d having two branch portions (branch portions 551, 552) extending from an end of the boss 55c on the opposite side of the side continuing to the flange portion 55b, in directions separating from each other.

The second plunger 56 includes a tip portion 56a having a tapered pointed shape, a flange portion 56b extending from the base end side of the tip portion 56a and having a diameter larger than that of the tip portion 56a, a boss 56c extending from an end of the flange portion 56b on the opposite side of the side continuing to the tip portion 56a, and having a diameter smaller than that of the flange portion 56b, and a base end portion 56d having a cylindrical shape and extending from an end of the boss 56c that is on the opposite side of the side continuing to the flange portion 56b, all of which are coaxially positioned.

In the base end portion 55d, the maximum distance (tip side distance) between the branch portions 551 and 552 is greater than the diameter of the internal space in the base end portion 56d (the diameter in the direction perpendicular to the extending direction). Therefore, when the branch portions 551, 552 are inserted in the base end portion 56d, it can be ensured that the outer circumferential surface of the branch portions 551, 552 is pressed against the inner circumferential surface of the base end portion 56d.

The branch portions 551, 552 may be formed by dividing the base end portion having a cylindrical shape into two in the central axis direction, with a blade tool or the like, and by bending so that the branch portions 551, 552 extend at predetermined angles.

In the third modification, the base end portion 56d may be tightened by the coil spring 53 so that the base end portion 56d is pressed against with the branch portions 551, 552 with a higher load. Furthermore, explained in the third modification is an example in which two branch portions are provided, but the number of the branch portions provided may be three or more.

Furthermore, in the third modification described above, the first plunger 55 may be supported by the coil spring 53 by press-fitting the boss 55c into the coil spring 53, and coupling the boss 55c with the coil spring 53, or the diameter of the boss 55c may be set smaller than the internal diameter of the coil spring 53 so that the coil spring 53 abuts against the flange portion 55b, and the flange portion 55b is supported by the coil spring 53. Furthermore, the boss 56c of the second plunger 56 may also be press-fitted into the coil spring 53, or the flange portion 56b may be supported by the coil spring 53.

Third Embodiment

Figure 17:
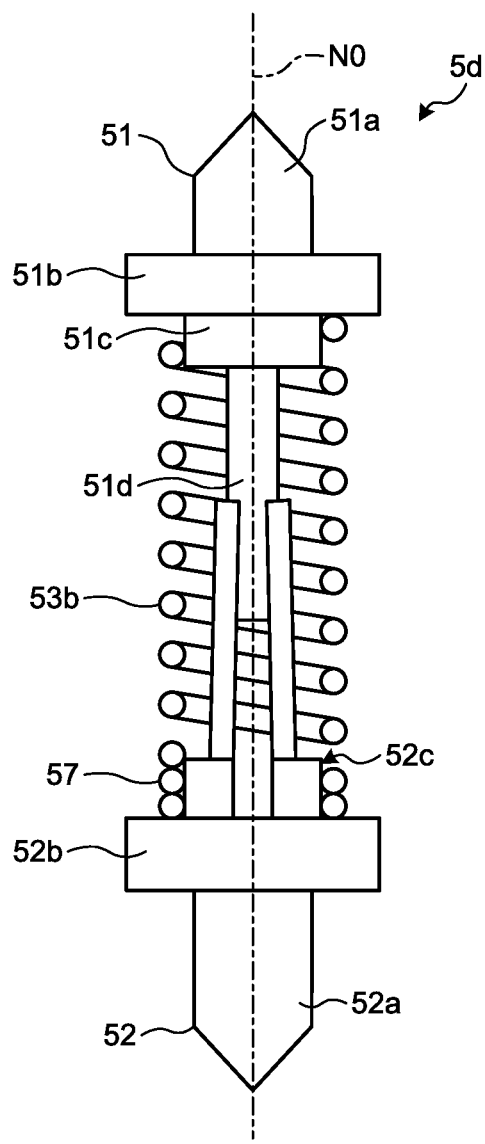
FIG. 17 is a partial sectional view illustrating a structure of a contact probe according to a third embodiment of the present invention.

FIG. 17 is a partial sectional view illustrating a structure of a contact probe according to a third embodiment of the present invention. Explained in the second embodiment above is an example in which the first boss 521a and the second boss 522a are tightened by press-fitting the coil spring 53, but in a probe 5d according to the third embodiment, the first boss 521a and the second boss 522a are tightened by a tightening member 57 that is provided separately from a coil spring 53b. In the third embodiment, the coil spring 53b and the tightening member 57 serve as a supporting unit.

The probe 5d according to the third embodiment includes the first plunger 51 and the second plunger 52 described above, a coil spring 53b, and the tightening member 57. The coil spring 53b has a length shorter than that of the coil spring 53 described above in the axial direction of the winding. The spring constant of the coil spring 53b may be the same as or different from that of the coil spring 53.

The tightening member 57 is a coil spring formed by solid-coiling a wire. The inner diameter of the wire of the tightening member 57 is smaller than the diameter of the outer circumferences of the first boss 521a and the second boss 522a. The tightening member 57 may be made from a wire wound at a predetermined pitch.

The tightening member 57 is press-fitted onto the first boss 521a and the second boss 522a. The first boss 521a and the second boss 522a are then tightened by press-fitting the tightening member 57, and elastically deform in a direction approaching each other and in a direction contacting the outer circumference of the base end portion 51d, and the diameter of these bosses becomes smaller. When the diameter of the first boss 521a and the second boss 522a becomes smaller, the first extending portion 521b and the second extending portion 522b are also moved toward the axis N0. This movement causes the diameter formed by the inner circumferential surfaces of the first extending portion 521b and the second extending portion 522b to become smaller. As a result, the first extending portion 521b and the second extending portion 522b are pressed against the outer circumferential surface of the base end portion 51d.

According to the third embodiment described above, because, in the second plunger 52, the first extending portion 521b and the second extending portion 522b are configured to slide while being pressed against the base end portion 51d by the tightening force of the tightening member 57, the pressure at which the tongue part group 52c (the first extending portion 521b and the second extending portion 522b) is brought into contact with the base end portion 51d can be increased, and the contact can be stabilized, and the contact resistance can be stabilized with a simple structure.

Furthermore, according to the third embodiment described above, the tightening member 57 is provided separately from the coil spring 53b, and the first boss 521a and the second boss 522a are tightened by the tightening member 57, and the coil spring 53b does not have the function for tightening. Therefore, extension and compression of the first plunger 51 and the second plunger 52, and tightening of the first boss 521a and the second boss 522a can be designed independently.

Explained in the third embodiment above is an example in which the tightening member 57 is a coil spring, but the tightening member 57 may be a C ring, an O ring, or a member having a cylindrical shape. Any tightening member having an inner circumference with a diameter smaller than diameter of the outer circumference of the first boss 521a and the second boss 522a, and being capable of elastically deforming may be used. The diameter of the coil spring may be larger than the tightening member.

Fourth Embodiment

Figure 18:
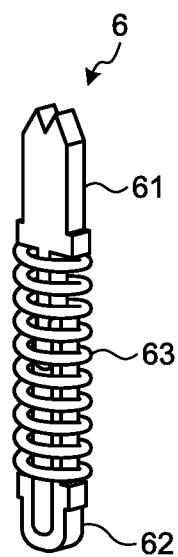
FIG. 18 is a perspective view illustrating a structure of a connection terminal according to a fourth embodiment of the present invention.
Figure 19:
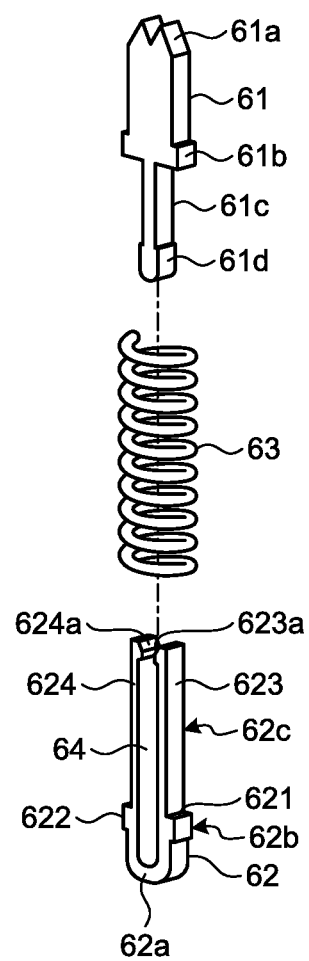
FIG. 19 is an exploded perspective view illustrating a structure of a connection terminal according to the fourth embodiment.

FIG. 18 is a perspective view illustrating a structure of a connection terminal according to a fourth embodiment of the present invention. FIG. 19 is an exploded perspective view illustrating the structure of the connection terminal according to the fourth embodiment. In the first to the third embodiments above, the structure of the connection terminal is explained with an exemplary contact probe having a substantial cylindrical shape, but this connection terminal 6 according to the fourth embodiment is provided as a plate-shape member.

The connection terminal 6 includes a first contact member 61 that has a substantially flat plate shape, and that has one end brought into contact with and being capable of being electrically connected to a connection target, a second contact member 62 that has a substantially flat plate shape, that has one end brought into contact with and being capable of electrically connecting with the connection target, and that is capable of connecting with the first contact member 61, and a coil spring 63 that is capable of supporting the first contact member 61 and the second contact member 62 in an extensible and compressible manner along the longitudinal direction. In the explanation hereunder, among the surfaces of the flat plate, those occupying a larger area and facing each other are referred to as principal surfaces, the surfaces substantially perpendicular to the principal surfaces are referred to as side surfaces. The direction perpendicular to the principal surfaces is referred to as a plate-thickness direction, and the direction perpendicular to the plate-thickness direction and the longitudinal direction is referred to as a width direction.

The first contact member 61 is made of a conductive material. The first contact member 61 includes a tip portion 61a having a tapered pointed shape and a plurality of pointed portions, a flange portion 61b extending from the base end side of the tip portion 61a, and having a width greater than that of the tip portion 61a, an extending portion 61c extending from an end of the flange portion 61b on the opposite side of the side continuous to the tip portion 61a and extending in a prism-shape, and a base end portion 61d extending from an end of the extending portion 61c on the side opposite to the side coupled to the flange portion 61b, and having a width larger than the width of the extending portion 61c, all of which are coaxially positioned.

The second contact member 62 is made of a conductive material. The second contact member 62 has a tapered pointed shape, and includes a tip portion 62a having a substantial U-shape in the plan view in the plate-thickness direction, a flange portion 62b having two flanges extending in the width direction from respective base end portions of the tip portion 62a (a first flange portion 621 and a second flange portion 622), and a tongue part group 62c having two tongue parts (a first tongue part 623 and a second tongue part 624) extending from the respective base end portions of the tip portion 62a, all of which are coaxially positioned. With the structure described above, the second contact member 62 has as substantial U-shape with a hollow space 64 in the plan view.

Each of the first tongue part 623 and the second tongue part 624 has a pillar-shape extending in parallel in the longitudinal direction. The distance between the first tongue part 623 and the second tongue part 624 is approximately the same as the width of the base end portion 61d, while no external load (except for the gravity) is applied to these tongue parts. The first tongue part 623 and the second tongue part 624 have a protrusion 623a and a protrusion 624a, respectively, that are provided on the ends of the respective tongue parts, the ends being on the side that is not the side of the tip portion 62a, and each of which protrudes toward a tongue part facing the other tongue part.

The first contact member 61 and the second contact member 62 are made of a noble metal or a noble metal alloy, and formed by machining. Examples of the noble metal include gold (Au), silver (Ag), platinum (Pt), palladium (Pd), and rhodium (Rh). The noble metal alloy is an alloy including any of the noble metals mentioned above. It is also possible to provide coating of a noble metal mentioned above to the first contact member 61 and the second contact member 62 made of copper, a copper alloy, or iron.

The coil spring 63 is a winding of a wire in a spiral shape. The diameter of the inner circumference of the coil spring 63 is smaller than the diameter of a circumscribed circle around the tongue part group 62c. The circumscribed circle herein is a circle circumscribing a cross section of the tongue part group 62c, cut across a plane in parallel with the width direction. As illustrated in FIG. 19, one end of the coil spring 63 abuts against the flange portion 61b, so that the first contact member 61 is supported by the one end, and the tongue part group 62c is press-fitted into the other end, and the other end abuts against the flange portion 62b, so that the second contact member 62 is supported thereby. In this manner, the extending portion 61c, the base end portion 61d, and the tongue part group 62c are surrounded by the coil spring 63, with the first contact member 61 and the second contact member 62 engaged with each other.

At least the surface of the coil spring 63 is insulating. The insulating property can be achieved by coating the surface of the coil spring 63 with an insulating resin such as enamel, or by forming a coil with a wire made of an insulating resin or a ceramic, or using a wire material having a higher resistance than that of the first and the second contact members.

The first contact member 61 and the second contact member 62 are coupled via the extending portion 61c and the base end portion 61d inserted into the space (the hollow space 64) formed between the first tongue part 623 and the second tongue part 624. In this configuration, the first tongue part 623 and the second tongue part 624 are in sliding contact with the base end portion 61d. The base end portion 61d and the protrusions 623a, 624a being engaged with each other serves as a function for preventing disengagement of the first contact member 61 and the second contact member 62.

The first tongue part 623 and the second tongue part 624 are press-fitted into the coil spring 63. The first tongue part 623 and the second tongue part 624 are then tightened by press-fitting, and elastically deform in the directions approaching each other. By causing the first tongue part 623 and the second tongue part 624 to approach each other, the first tongue part 623 and the second tongue part 624 become pressed against the outer circumferential surface of the extending portion 61c.

According to the fourth embodiment described above, because, in the second contact member 62, the first tongue part 623 and the second tongue part 624 are configured to slide while being pressed against the base end portion 61d by the tightening force of the coil spring 63, the pressure at which the tongue part group 62c (the first tongue part 623 and the second tongue part 624) is brought into contact with the base end portion 61d can be increased, and the contact can be stabilized, and the contact resistance can be stabilized with a simple structure.

Explained in the fourth embodiment above is an example in which the base end portion 61d and the protrusions 623a, 624a serve as the structure for preventing the disengagement of the first contact member 61 and the second contact member 62, but in a configuration in which these contact members are press-fitted into the coil spring, these elements (the base end portion and the protrusions) may be omitted.

It is also possible, in the fourth embodiment described above, to provide the tightening member according to the third embodiment, and to tighten the first tongue part 623 and the second tongue part 624 with the tightening member 57.

In the fourth embodiment described above, the tip portion 61a and the flange portion 61b of the first contact member 61 may be rotated by 90 degrees with respect to the tongue part group 62c.

In the first to the third embodiments described above, the ends of the flange portions on the side of the tip portion, and the wall between the large diameter portion and the small diameter portion of the holder hole may be tapered. This configuration enables the probe to be aligned more reliably in the direction perpendicular to the axial direction, when the probe is mounted to the holder.

Furthermore, explained in the first and second embodiments and their modifications is an example in which the flange portions and the bosses are provided, but another configuration without the flange portions and the bosses is still possible, as long as the coil spring having a function for preventing the disengagement is press-fitted.

Furthermore, used in the first to the fourth embodiments and their modifications described above is an example in which the coil spring is made from a wire, but the wire may be any wire having a circular or an elliptical, or a rectangular cross section in the direction perpendicular to the longitudinal direction of the wire. When the wire is rectangular, the load required in extending and compressing the first plunger (first contact member) and the second plunger (second contact member), and the load required in tightening these plungers can be increased.

The first to the fourth embodiments and their modifications described above are provided merely as examples of how the present invention is implemented, and the present invention is not limited thereto. The present invention can produce various other inventions by combining the elements disclosed in the embodiments and the modifications, as appropriate. For example, the plungers disclosed in the first to the third embodiments may be combined with the contact member according to the fourth embodiment. The present invention may also be modified variously depending on specifications, and it should be clear that other various embodiments are still possible within the scope of the present invention.

INDUSTRIAL APPLICABILITY

As described above, the contact probe according to the present invention is useful in stabilizing the contact resistance with a simple structure.

REFERENCE SIGNS LIST 1 probe unit
2, 2a, 5, 5a, 5b, 5c, 5d contact probe (probe)
3 probe holder
4 holder member
6 connection terminal
21, 51, 55, 210 first plunger
21a, 22a, 51a, 52a, 54a, 55a, 56a tip portion
21b, 22b, 51b, 52b, 54b, 55b, 56b flange portion
21c, 22c, 51c, 55c, 56c boss
21d, 22d, 21e, 22e, 51d, 55d, 56d base end portion
22, 52, 54, 56, 220 second plunger
23, 53, 53a, 53b, 63 coil spring
31 first member
32 second member
33, 34 holder hole
52c, 54c, 62c tongue part group
57 tightening member
61 first contact member
62 second contact member
100 integrated semiconductor circuit
101 connecting electrode
200 circuit board
201 electrode
521, 623 first tongue part
521a first boss
521b first extending portion
522, 624 second tongue part
522a second boss
522b second extending portion
551, 552 branch portion

The invention claimed is:

1. A conductive connection terminal that is extensible and compressible in a longitudinal direction, comprising:
   a first contact member including
      a first tip portion configured to contact with one electrode of a contact target, and
      a first base end portion;
   a second contact member including
      a second tip portion configured to contact with another electrode of the contact target,
      a flange portion,
      a boss, and
      a plurality of tongue parts configured to contact with the first base end portion;
   an elastic member configured to extend and compress the first contact member and the second contact member in the longitudinal direction; and
   a load applying unit configured to apply a load to one end of the tongue parts near the second tip portion in a load applying direction so as to bring the tongue parts into contact with an outer circumference of the first base end portion,
   wherein
   the elastic member and the load applying unit are provided as a same member,
   each of the tongue parts is divided by a slit extending from an end of each tongue part toward the second tip portion in an axial direction of the second contact member,
   the boss has a diameter larger than a width of the tongue parts in the load applying direction, and
   the load applying unit applies the load at the boss.

2. The connection terminal according to claim 1, wherein the elastic member and the load applying unit are provided as one coil spring that is made from a winding of a wire.

3. A conductive connection terminal that is extensible and compressible in a longitudinal direction, comprising:
   a first contact member including
      a first tip portion configured to contact with one electrode of a contact target, and
      a first base end portion;
   a second contact member including
      a second tip portion configured to contact with another electrode of the contact target,
      a flange portion,
      a boss, and
      a plurality of tongue parts configured to contact with the first base end portion;
   an elastic member configured to extend and compress the first contact member and the second contact member in the longitudinal direction; and
   a load applying unit configured to apply a load to one end of the tongue parts near the second tip portion in a load applying direction so as to bring the tongue parts into contact with an outer circumference of the first base end portion,
   wherein
   the load applying unit is a tightening member that is any one of a coil spring, a C ring, an O ring, and a cylindrical shaped member that applies a load to the tongue parts in the direction bringing the tongue parts into contact with the outer circumference of the first base end portion,
   each of the tongue parts is divided by a slit extending from an end of each tongue part toward the second tip portion in an axial direction of the second contact member,
   the boss has a diameter larger than a width of the tongue parts in the load applying direction, and
   the load applying unit applies the load at the boss.

4. The connection terminal according to claim 1, wherein each of the tongue parts is divided by the slit extending from an end of the tongue part toward the second tip portion in an axial direction of the second contact member, and
   the slit extends at least to a position of the tongue part at which the load is applied.

5. The connection terminal according to claim 1, wherein each of the tongue parts is divided by the slit extending from an end of the tongue part toward the second tip portion in an axial direction of the second contact member, and
   the slit extends beyond a position of the tongue part at which the load is applied.

6. The connection terminal according to claim 1, wherein at least one of the first contact member and the second contact member has a plate-shape.

7. The connection terminal according to claim 1, wherein the first contact member, the second contact member, the elastic member and the load applying unit are coaxially positioned along a same axis.

8. The connection terminal according to claim 1, wherein the direction crosses the longitudinal direction of the conductive connection terminal.

9. The connection terminal according to claim 1, wherein the direction is orthogonal to the longitudinal direction of the conductive connection terminal.

10. A conductive connection terminal that is extensible and compressible in a longitudinal direction, comprising:
    a monolithic first contact member including
       a first tip portion configured to contact with one electrode of a contact target, and
       a first base end portion;
    a monolithic second contact member including
       a second tip portion configured to contact with another electrode of the contact target,
       a flange portion,
       a boss, and
       a plurality of tongue parts configured to contact with the first base end portion;
    an elastic member configured to extend and compress the first contact member and the second contact member in the longitudinal direction; and
    a load applying unit configured to apply a load to one end of the tongue parts near the second tip portion in a load applying direction so as to bring the tongue parts into contact with an outer circumference of the first base end portion,
    wherein
    the elastic member and the load applying unit are provided as a same member,
    each of the tongue parts is divided by a slit extending from an end of each tongue part toward the second tip portion in an axial direction of the second contact member,
    the boss has a diameter larger than a width of the tongue parts in the load applying direction, and
    the load applying unit applies the load at the boss.

11. The conductive connection terminal according to claim 1, wherein
    an outer circumference of the first base end portion, an outer circumference of the boss, an outer circumference of each of the tongue parts and an inner circumference of each of the tongue parts are arc-shaped, and the arc-shaped inner circumferences of the tongue parts surround the arc-shaped outer circumference of the first base end portion.

12. The conductive connection terminal according to claim 11, wherein the slit extends beyond the load applying unit in the axil direction.

* * * * *